United States Patent
Le et al.

(10) Patent No.: US 11,552,732 B2
(45) Date of Patent: Jan. 10, 2023

(54) POLAR CODING SYSTEM AND PARALLEL COMPUTATION METHOD FOR POLAR CODING SYSTEM

(71) Applicant: VIETTEL GROUP, Ha Noi (VN)

(72) Inventors: Thanh Bang Le, Ha Noi (VN); Tuan Linh Tu, Nghe an Province (VN)

(73) Assignee: VIETTEL GROUP, Ha Noi (VN)

( * ) Notice: Subject to any disclaimer, the term of this patent is extended or adjusted under 35 U.S.C. 154(b) by 254 days.

(21) Appl. No.: 16/731,629

(22) Filed: Dec. 31, 2019

(65) Prior Publication Data

US 2020/0412479 A1 Dec. 31, 2020

(30) Foreign Application Priority Data

Jun. 28, 2019 (VN) ................. 1-2019-03458

(51) Int. Cl.
*H04L 1/00* (2006.01)
*H03M 13/13* (2006.01)

(52) U.S. Cl.
CPC .......... *H04L 1/0057* (2013.01); *H04L 1/0071* (2013.01); *H03M 13/13* (2013.01); *H04L 1/0041* (2013.01)

(58) Field of Classification Search
CPC ............ H03M 13/13; H03M 13/6561; H03M 13/611; H04L 1/0057; H04L 1/0071; H04L 1/0041
See application file for complete search history.

(56) References Cited

U.S. PATENT DOCUMENTS

| | | | |
|---|---|---|---|
| 10,075,197 B1 * | 9/2018 | Noh | H04L 1/0045 |
| 10,680,660 B2 * | 6/2020 | Saber | H03M 13/616 |
| 11,005,597 B2 * | 5/2021 | Xi | H04L 1/0072 |
| 11,070,317 B2 * | 7/2021 | Ye | H03M 13/13 |
| 11,165,448 B2 * | 11/2021 | Maunder | H03M 13/6362 |
| 2020/0287654 A1 * | 9/2020 | Xi | H03M 13/13 |
| 2020/0322085 A1 * | 10/2020 | Kudekar | H03M 13/13 |
| 2021/0125070 A1 * | 4/2021 | Wang | G06F 17/16 |
| 2021/0306005 A1 * | 9/2021 | Sheiman | H03M 13/00 |
| 2021/0385016 A1 * | 12/2021 | Ye | H03M 13/6362 |

* cited by examiner

*Primary Examiner* — Oussama Roudani
(74) *Attorney, Agent, or Firm* — patenttm.us

(57) ABSTRACT

The invention refers to the parallel calculation method for polarization coding (PCPE) for channel coding technique in 5th next generation mobile communication systems which includes to split N-bits input sequence into X parallel streams, each stream has Y bits; to multiply Y bits at each stream by the columns of the Kronecker matrix $G_Y$, the results are displayed in rows according to the principle of bit elimination; and to multiply the matrix obtained with the columns of the Kronecker matrix $G_X$ according to the sample repeat and scalar multiplication. In addition, the invention also refers to the polarization coding system according to the Parallel Computation for Polarization Encoding (PCPE) for the channel coding technique in the 5th next generation mobile communication system.

5 Claims, 9 Drawing Sheets

POLAR CODING SYSTEM AND PARALLEL COMPUTATION METHOD FOR POLAR CODING SYSTEM

TECHNICAL FIELD

The invention relates to the method for error correction coding technology for fifth-generation mobile communication systems, and in particular to the polar coding system and the parallel computation method for the polar coding system.

BACKGROUND

In radio communication systems, channel error correction coding techniques play an important role in the transmission of digital information to increase the ability to regenerate data affected by noise at the receiver. Channel coding techniques are generally developed and improved to solve the problem of algorithm optimization to improve the channel coding error or the problem of building coding techniques to correct errors with algorithm complexity and computational time within an acceptable range.

In fifth-generation channel coding techniques, polar coding is used for Physical Broadcast Channel (PBCH) and Up/Downlink Control Channels. The construction of polar coding architecture depends on factors such as the reliability of the channel corresponding to each bit in the input bit sequence and the input bit length and the coding rate as well as the signal to noise ratio of channel.

In principle, the polar coding technique consists of three steps. The first step is to interleave the input bit string to prevent clustering errors that occur during transmission. The second step is to locate the bits that carry information. This means that the output K bits of the interleaving step are considered to be information bits and are assigned to the N-bit sequence at specified locations. The location determined for the information bits is the ones that are less affected by interference and noise when the information bits are transmitted through the channel Finally, the N-string of output bits obtained after the assignment of the bit position is multiplied by the Kronecker matrix to produce the output bit sequence.

In fact, the multiplication of N-bit series with squared Kronecker matrix is performed sequentially. This means that each output bit is determined by sequential multiplication in the modulo-2 field of the input N-bit sequence with N elements of each column vector of the Kronecker matrix. However, the multiplication of the bit sequence with the squared matrix by sequential method is the main reason for the increase in time to implement the algorithm. This causes large processing delays that lead to affects on user service quality. Moreover, in the case of different data models, the increase in the number of bits in input sequences leads to an increase in the size of Kronecker matrix, which increases the computational complexity.

FIG. 3 describes how the polar coding block performs according to a known method in this technical field. In this way, multiplying the input N-bit sequence with the Kronecker matrix GN is performed sequentially. According to this method, elements on columns of the GN are stored in read-only memory (Read-Only Memory—ROM). The N-bits of the input sequence is multiplied in modulo-2 field sequentially with columns of the Kronecker GN with corresponding readings from the ROM memory.

The disadvantages of serial and sequential methods are low processing speed and slow computation time. Accordingly, for scalar multiplication of input N bits with the Kronecker GN matrix, a minimum of N clock pulses is required to obtain the output N-bits sequence after polarization coding. For 5th generation mobile communication systems, data models using polar channel coding often use large bit sequences (minimum 512 and maximum 1024). Thus, for the sequential calculation method, the greater the value of N leads to the increase in the time to calculate the multiplication and the speed of polarization coding processing.

BRIEF SUMMARY

Therefore, the purpose of the present invention is to propose a polar coding system and a parallel computation method for the polar coding system to improve the speed of the channel coding technique in fifth generation mobile systems. In particular, this is an effective method for polar coding blocks by improving the coding processing speed as well as reducing computation time, especially for input data models with large amounts of bits. This method also allows the reuse of stored hardware resources during the encoding process, ensuring simplicity and flexibility in the design process.

To achieve this purpose, the invention proposes a parallel computation method for polar coding (Parallel Computation for Polarization Encoding—PCPE) to improve processing speed and minimize the time of performing channel coding in the fifth generation mobile communication system.

DETAILED DESCRIPTION

Figures 1, 2:
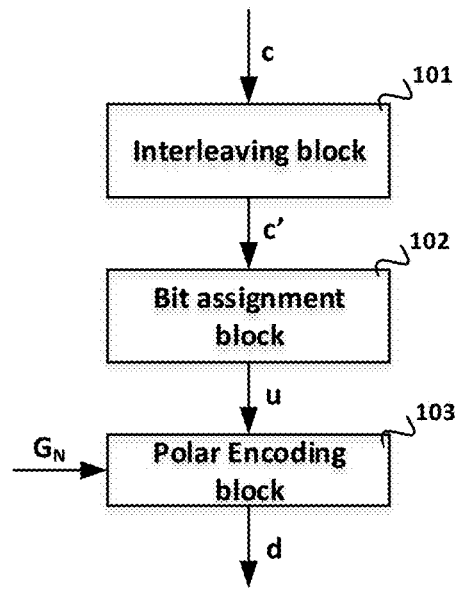
FIG. 1 depicts the functional blocks of polarization coding.
FIG. 2 illustrates Kronecker matrices with dimensions 2, 4 and 8, respectively.
Figure 3:
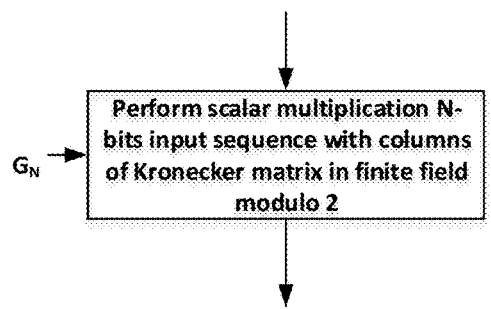
FIG. 3 depicts how to perform the coding step using a known method.

The invention proposes a polar coding system consisting of three main blocks: an interleaving block 101, a bit assignment block 102 and a polar encoding block 103 referenced in FIG. 1. In the system, the parallel computation technique (Parallel Computation for Polarization Encoding—PCPE) is integrated into the polar encoding block 103. In particular, the purpose of interleaving block 101 is to prevent clustering errors occurring in the bit sequence inserted into the encoder input. Accordingly, the position of the bits in the input bit sequence is changed based on the value of the interleaved index corresponding to the position of the bit being considered in the input bit sequence. Assuming the input bit string is length K, then the interleaving index set will take positive integers from 0 to K−1 and be shuffled according to the interleaving algorithm. The K-string output sequence after interleaving is forwarded to the bit assignment block 102. The purpose of bit assignment block 102 is to locate the information bits in the N-bit sequence before putting into the polar encoding block. The location assigned to the information bits is the ones that are less affected by noise and interference when they are transmitted through the channel medium. Accordingly, the K-bits sequence after the interleaving block 101 are located at the specified positions in the N-bit sequence. The remaining N−K bits are defined as bits that do not carry information and are set with the same constant value before performing polarization coding. The task of polar encoding block 103 is to multiply the output bit sequence of bit assignment block 102 with the Kronecker matrix. Accordingly, assuming that the length of output bit sequence of bit assignment block 102 equals to N, then, a squared Kronecker matrix (hereinafter denoted as GN) will be generated from primary Kronecker matrix. The result of multiplying N-bit sequences with Kronecker matrix GN is the output N-bit sequence after polar coding. Polar encoding block 103 consists of three main functional blocks described in FIG. 8 including: Serial to Parallel Converter 801, Row-based Scalar Multiplier 802, and Column-based Scalar Multiplier 803.

Figure 9:
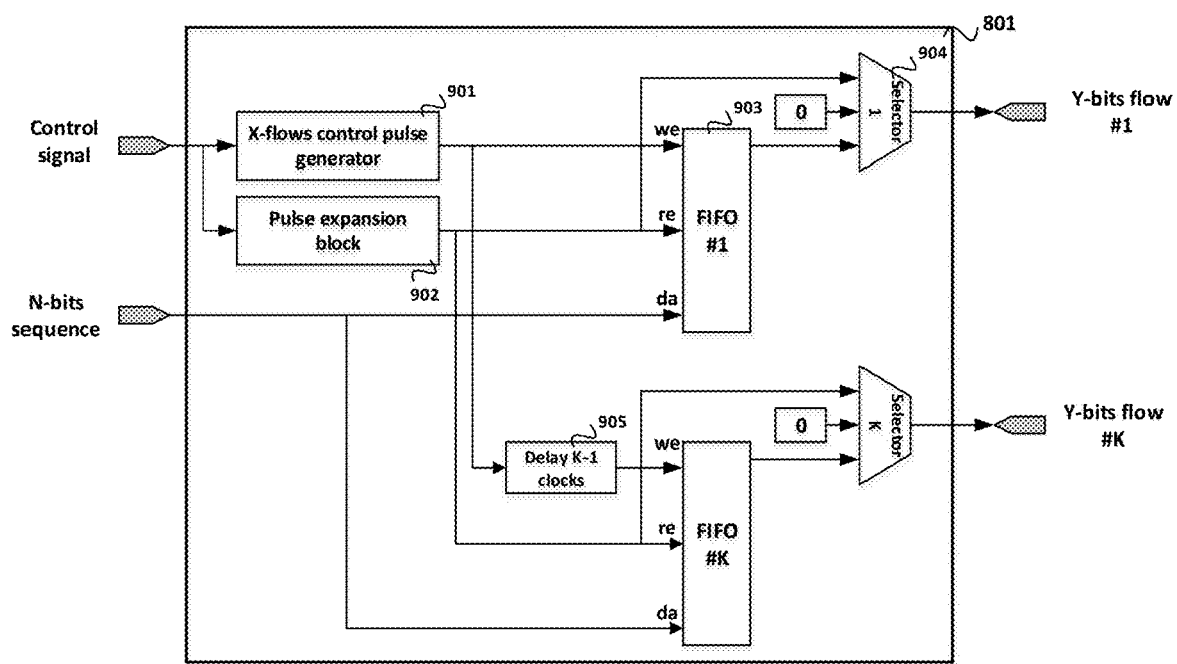
FIG. 9 depicts the design of a parallel series conversion unit.

FIG. 9 depicts the hardware design of the Serial to Parallel Converter 801. Accordingly, a control signal that exists in a clock cycle is forwarded to the input of the X-flows control pulse generator 901 and the pulse expansion block 902. The output of the X-flows control pulse generator 901 is a signal which exists in X clock cycles and has a width equal to one clock cycle delivered to the write control pin (denoted by "we") of the First Input First Output memory (FIFO) 903 to control writing of bit sequence at the input. The output signal of the pulse expansion block 902 is a signal which has a width Y times of clock cycle given to the read control pin (denoted by "re") of the memory 903 to control reading of bit string at the memory 903. Finally, the first multiplexer 904 is used to extract the Y-string at each output stream. In order to produce Y-bit data streams, the serial to parallel block 801 parallel uses the delay block 905. The delay block 905 receives the output signal of the X-flows control pulse generator 901 and the delay k clock cycles to create $(k+1)^{th}$ data stream Y-bits. Each Y-bits data stream will be forwarded to row-based scalar multiplier 802.

Figure 10:
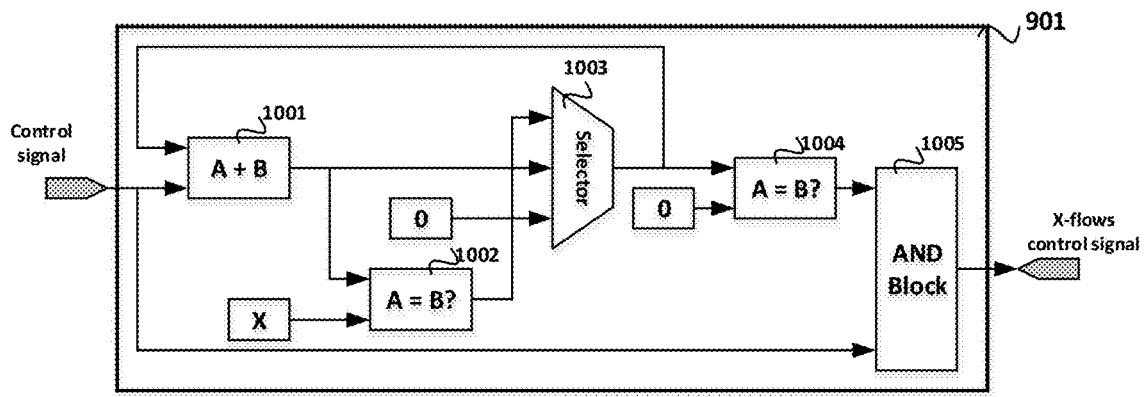
FIG. 10 depicts the design of the X-flow control pulse generator.

FIG. 10 depicts the hardware design of the X-flows control pulse generator 901. Accordingly, the X-flows control pulse generator 901 receives control signals that exist in one clock cycle and produces periodic signals with period being X times the clock cycle and width being one clock cycle at the output. Two-input arithmetic adder 1001 performs addition between the input control signal and the feedback signal at the selector 1003. The value obtained at the adder output is compared with the constant X uses the first comparator 1002. The output signal of second selector 1003 is compared to the value of 0 using the second comparator 1004. The signal at the second comparator 1004 is combined with the control input signal by "AND" logic using the logical block AND 1005.

Figure 11:
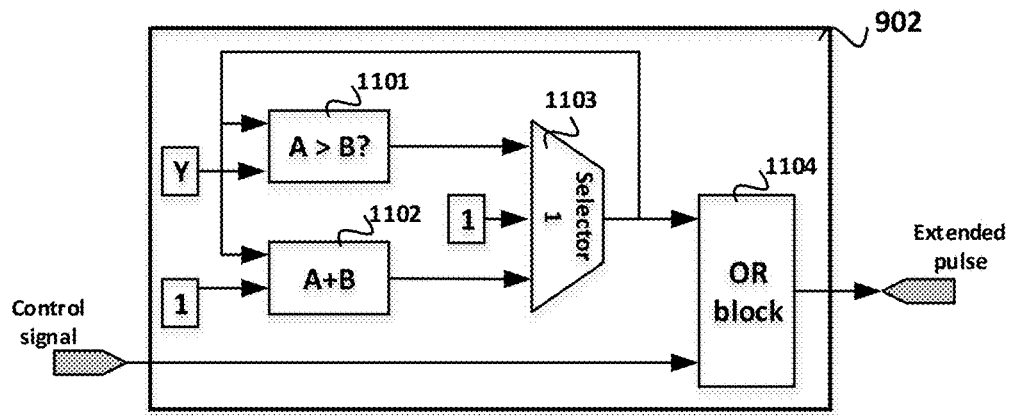
FIG. 11 depicts the hardware design of the extended pulse unit.

FIG. 11 depicts the hardware design of the pulse expansion block 902. Accordingly, the control signal that exists in one clock cycle is brought to its input. A constant value that describes the desired pulse width (Y clock cycles) at the output is configured for the pulse expansion block 902. The two-input comparator unit 1101 performs a comparison of the desired constant value and the output of the third selector 1103 to provide the control signal of output of the third selector 1103. The arithmetic adder 1102 executes addition the selector output signal with value 1. Finally, the output signal of selector 1103 is combined with the input control signal using logical block OR 1104.

Figure 12:
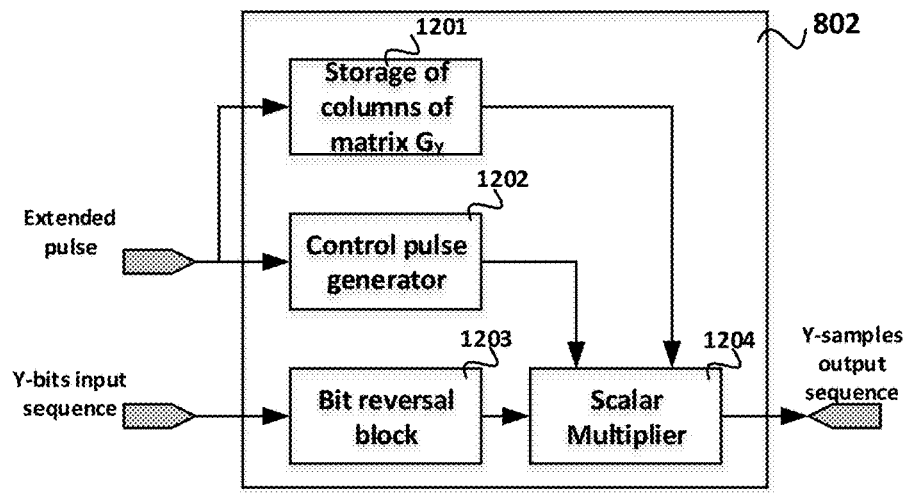
FIG. 12 depicts the connecting of sub-blocks in the row-based scalar multiplier.

FIG. 12 depicts the diagram of connecting the child blocks in the row-based scalar multiplier 802 at a given Y-bits stream. The elements on the columns of the Kronecker GY matrix are stored in memory 1201 containing columns of matrix GY. The extended pulse signal with width being Y clock cycles (that is the output of the pulse expansion block 902) is brought to the control pulse generator 1202. The output of the control pulse generator 1202 is Y control signals with width of them being from 1 to Y the clock cycles is taken to the input of scalar multiplier 1204. The multiplier 1204 uses these control signals in combination with the output of the memory block 1201 matrix columns to change Y-bits streams after going through the bit invertr 1203 according to the bit removal rule (Bit Removal Rule—BRR).

Figure 13:
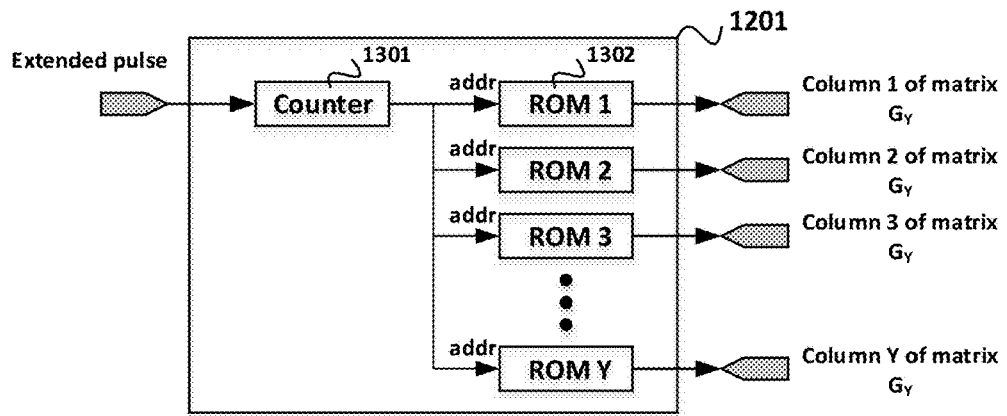
FIG. 13 depicts the design for storage columns of Kronecker matrix GY.

FIG. 13 depicts the design of the memory 1201 for storage columns of Kronecker matrix GY. The extended pulse signal is sent to the first counter 1301 which increases gradually after each clock cycle. The output of the first counter 1301 is taken to the address input of read-only memory ROM 1302. The elements on the columns of the Kronecker GY matrix are stored in read-only memory ROM 1302 and read out followed by the cycle of the clock.

Figure 14:
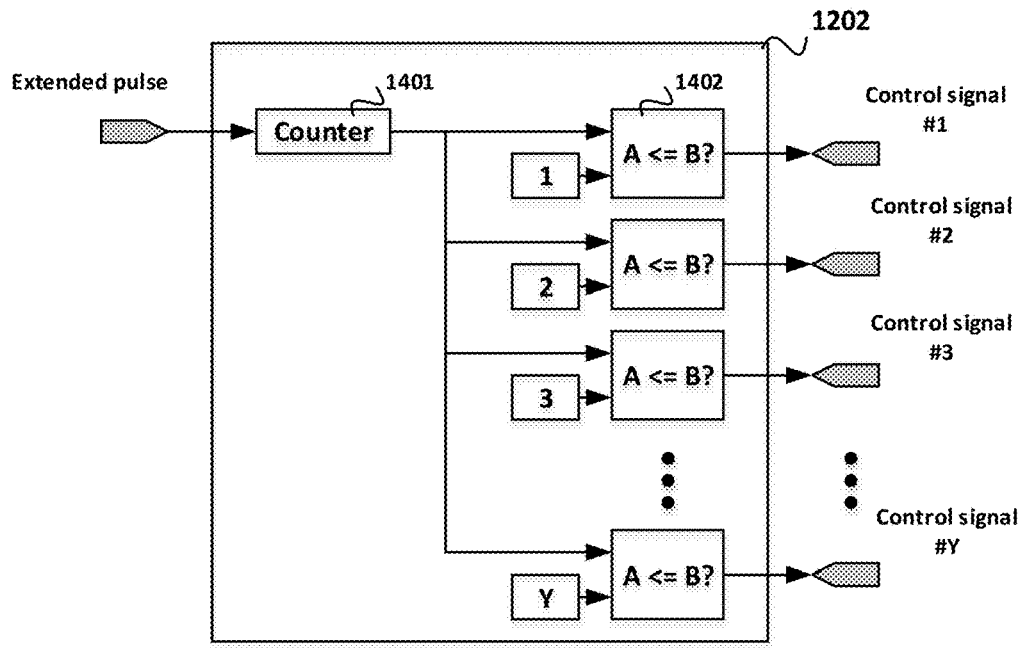
FIG. 14 depicts the design of the control pulse generator.

FIG. 14 depicts the design of the control pulse generator 1202. Extended pulse signals are fed into the second counter 1401 that increase gradually after each clock cycle. The value obtained at the output of counter 1401 is taken to the input of the Y comparators 1402. The comparator 1402 performs a comparison between the output value of counter with the value increasing gradually from 1 to Y. The output of the comparators 1402 is the control signals forwarded to the scalar multiplier 1204.

Figure 15:
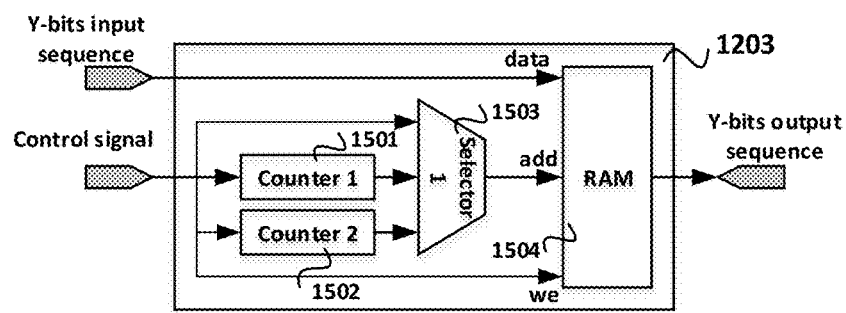
FIG. 15 depicts the invert-bit block design.

FIG. 15 depicts the design of the bit reversal block 1203. The Y-bits sequence is taken to the data input (designated as "data") of random access memory (RAM) 1504. The third counter 1501 counts gradually from 1 to Y and the fourth counter 1502 counts gradually from Y to 1. Outputs of two counters are fed into the inputs of the fourth selector 1503. Output signal of counter 1503 is taken to the address input (denoted by "add") of the memory RAM 1504.

Figure 16:
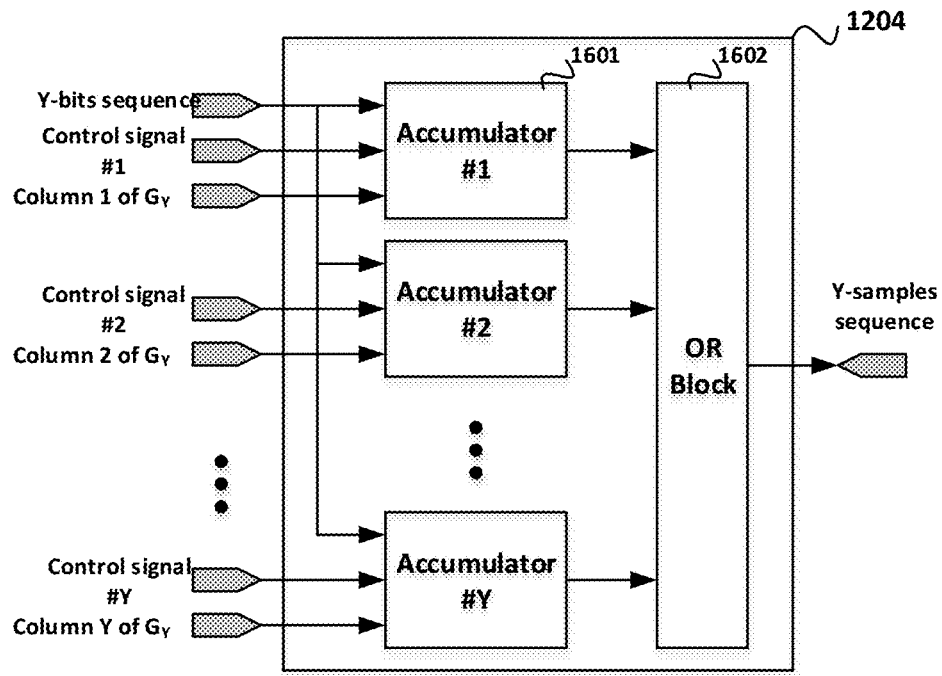
FIG. 16 depicts the design of row-based scalar mutiplier.

FIG. 16 depicts the design of the scalar multiplier 1204. The scalar multiplier 1204 receives three input sources including the Y-bits sequence from the bit reversal 1203, the control signal from the control signal generator 1202, and information about columns of the Kronecker matrix rom the storage block 1201. In the scalar multiplier 1204, the accumulating blocks 1601 execute scalar multiplication according to the bit removal rule—BRR). The output of the accumulating blocks 1601 will be combined together using the logical OR 1602.

Figure 17:
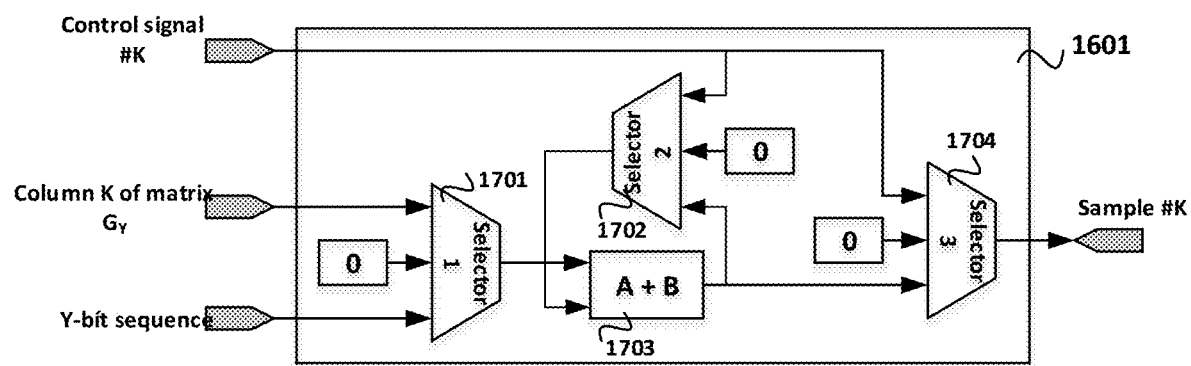
FIG. 17 depicts the design of the cumulative addition block.

FIG. 17 depicts the design of a given cumulating block 1601 among total Y accumulating blocks according to the Bit Removal Rule (BRR). The signal obtained from the $k^{th}$ column of the Kronecker matrix GY is brought to the control pin of the fifth selector 1701. The output of the fifth selector 1701 is taken to the first input of the adder 1703. The adder 1703 performs cumulative addition with two inputs that are the values obtained from the fifth selector 1701 and the sixth selector 1702. The $k^{th}$ control signal is sent to the control pins of the sixth selector 1702 and seventh selector 1704. The output of seventh selector 1704 is the $k^{th}$ sample obtained.

Figure 18:
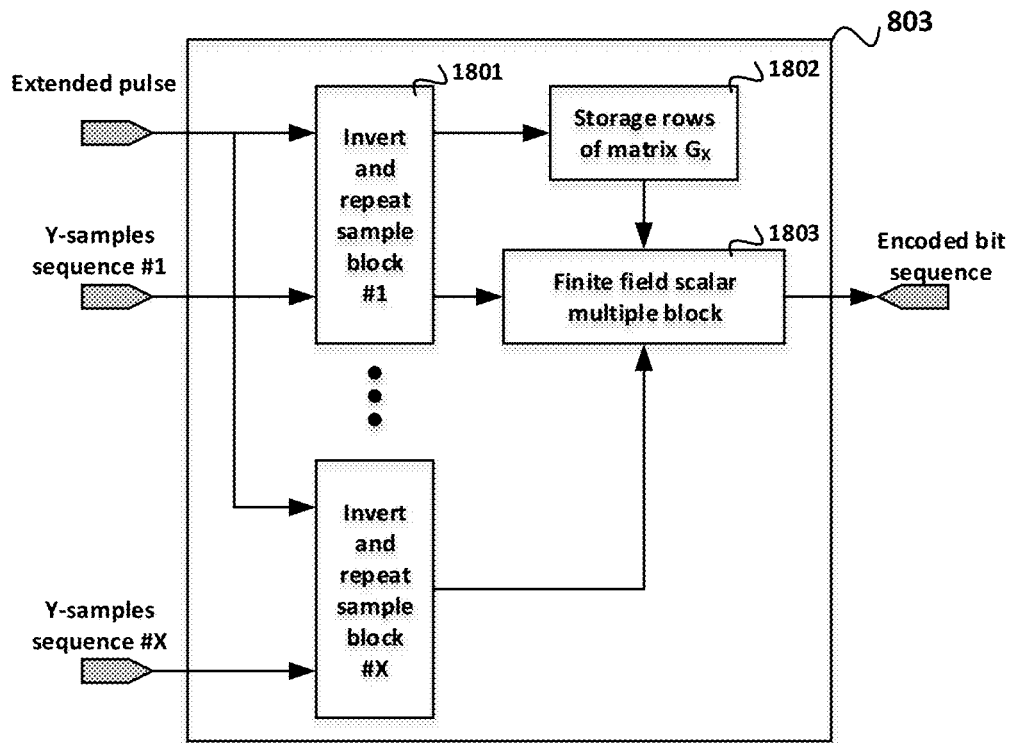
FIG. 18 depicts the connecting of sub-blocks in the column-based scalar multiplier.

FIG. 18 depicts the connection of the sub-blocks in the columns-based scalar multiplier 803. The Y-samples sequences obtained from the scalar multiplier 1204 are taken to the inverted and repeated sample blocks 1801 together with the extended pulse signal. The memory 1802 is utilized for storage rows of Kronecker matrix GX according to the control signal from the output of the inverted and repeated sample block 1801. Scalar multiplier 1803 in finite field associated with inverted and repeated sample blocks 1801 will perform repeat and scalar multiplication samples according to the principle of sample repeat and scalar multiple (SRSM) to obtain the output bit chain after polarization coding.

Figure 19:
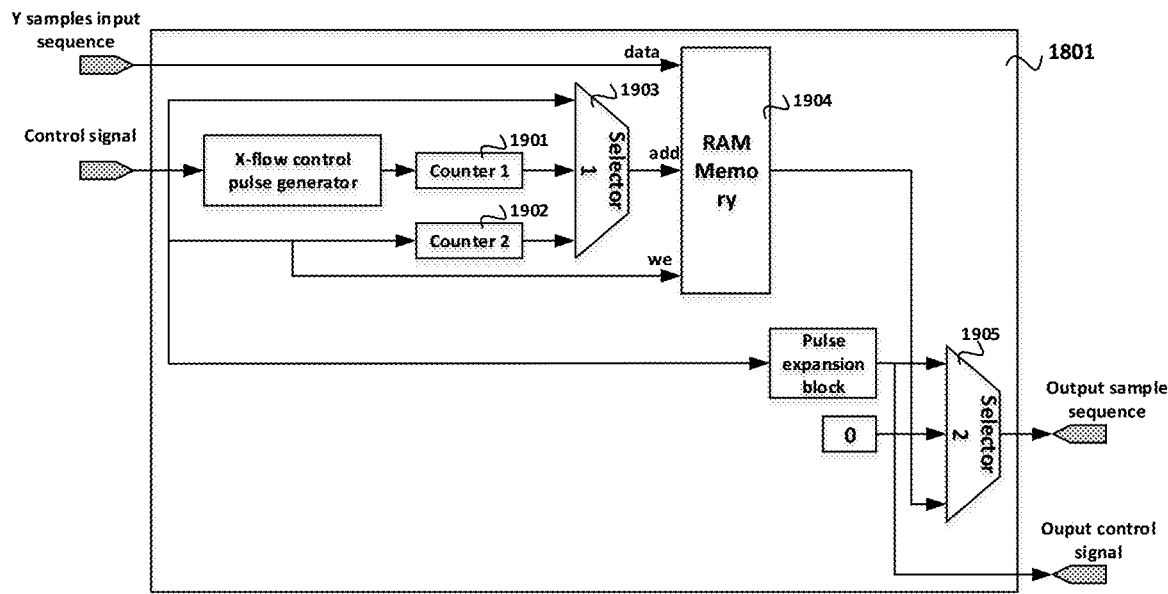
FIG. 19 depicts a repeating sample block.

FIG. 19 depicts the inverting and repeating sample block 1801. The control signal is applied to the X-flows control pulse generator 901 to produce a periodic signal with the period being X times the clock cycle and the width being one clock cycle. This signal is then used to drive the fourth counter in 1901 to perform an incremental counting from 1 to the Y. The control signal at the input is taken to the control pin of the fifth counter 1902. The output of the two counters is sent to the eighth selector 1903. The output of the eighth selector 1903 is connected directly to the input address of the memory RAM 1904, controlling the reading and writing of the Y-bits stream. The input control signal is also passed through the pulse expansion block 902 to generate the output control pulse whose width is exactly equals to N clock cycles. The ninth selector 1905 takes the signal at the output of the selector as a control signal to extract the output sample sequence of the inverting and repeating sample block 1801.

Figure 20:
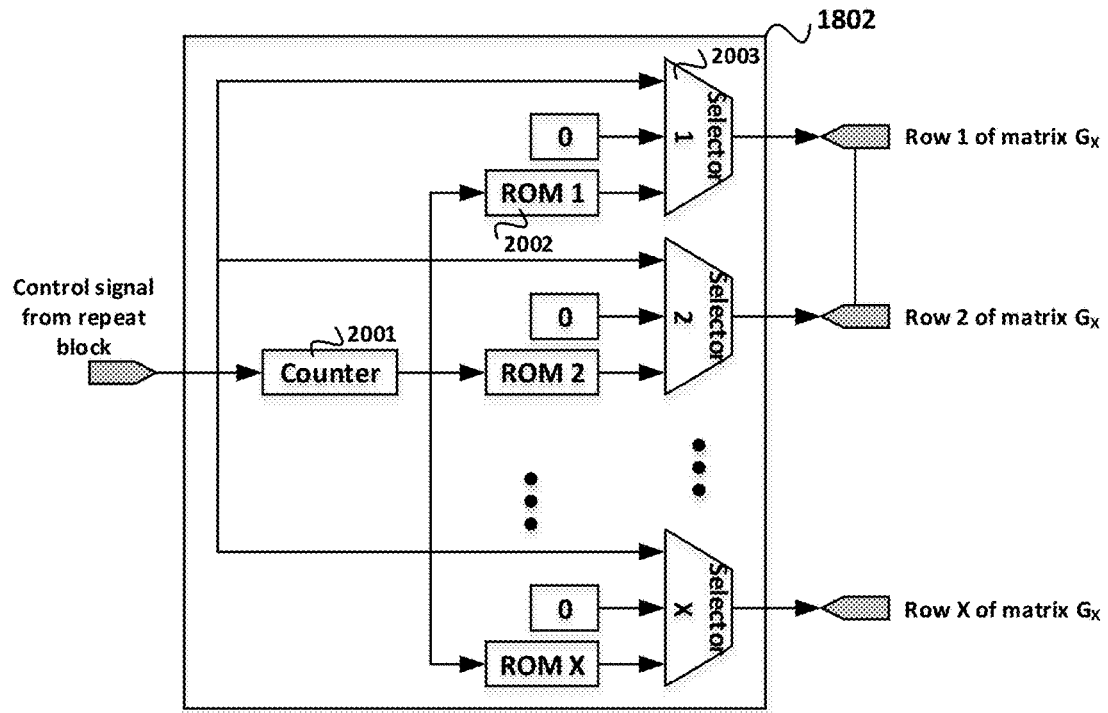
FIG. 20 is a design for storage rows of Kronecker matrix GX.

FIG. 20 depicts the block design of memory 1802 for storage rows of Kronecker matrix GX. The control signal at the inverting and repeating sample block 1801 is used to control the sixth counter 2001, which performs an incremental counting from 1 to X. The output signal of sixth counter 2001 is passed to the address input of the memory ROM 2002. The memory ROM 2002 is responsible for saving elements on the rows of the Kronecker matrix GX. The tenth selector 2003 uses a control signal to extract readable values from the memory ROM 2002.

Figure 21:
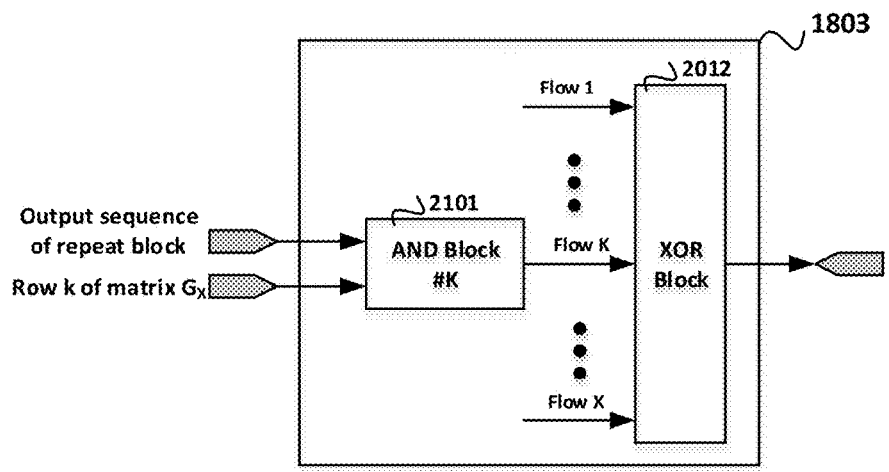
FIG. 21 depicts a scalar kernel design in a finite field.

FIG. 21 depicts the design of scalar multiplier in finite field 1803. Output sequence of inverting and repeating sample block 1801 of the $k^{th}$ data stream is combined with the $k^{th}$ row of the Kronecker matrix GX using logical block AND 2101. There are X logical blocks AND 2101 corresponding to X data streams. The signal at the output of logical blocks AND 2101 is brought to the logical block XOR 2102. The output of logical block XOR 2102 is the N-bits stream after polarization coding.

FIG. 2 depicts examples of Kronecker matrixs G2, G4 and G8. The characteristics of Kronecker matrices are square and upper triangle. Moreover, Kronecker matrices only contain elements 0 and 1. And interestingly, elements on the main diagonal are equal to 1. The Kronecker G2 matrix is called the primitive matrix. Kronecker matrices with order being larger than 2 are usually determined through this primitive matrix. In general, the N-order squared Kronecker matrix is determined by the formula: $G_N = G_2^{\otimes n}$ with $n = \log_2 N$.

Figure 7:
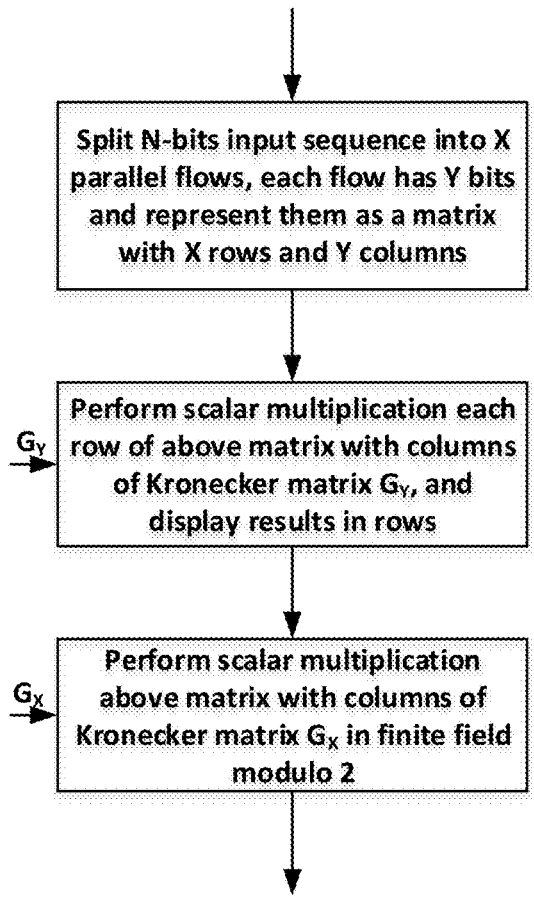
FIG. 7 depicts how to perform polarization coding according to the proposed method of the present invention.

According to the invention implementation, refer to FIG. 7, the parallel computation method for polarization coding to enhance the speed for channel coding techniques in fifth-generation mobile systems is carried out sequentially as follows.

Step 1 is to parallelize the sequence of N-bits of input into X streams, each stream contains Y bits follows the principle RAC (Row After Column). It means that if we consider the output of this step to be a matrix of X rows and Y columns, the bits of the sequence of N input bits are arranged into the matrix in an orderly manner according to the principle RAC. Specifically, refer to FIG. 8, output N-bits stream after the bit assignment block 102 (denoted by "u") is brought to the polarization encoding system using Parallel Computation for Polarization Encoding—PCPE) according to the invention proposal. First, the input bit sequence is sent to the Serial to Parallel block 801 to convert the input N-bits stream into parallel X streams, each of which has Y bits according to RAC arrangement principle.

Step 2 is to consider that each row in the matrix obtained in step 1 is a Y-bits streams, then, to multiply Y bits at each stream by the columns of the Kronecker matrix GY, the results are presented in rows according to the principle of bit elimination (Bit Removal Rule—BRR). Because the Y-bits streams are independent of each other, it is possible to simultaneously multiply the Y-bits streams with columns of the Kronecker matrix GY. Accordingly, the elements on the columns of the Kronecker matrix GY are stored in read-only memory ROM and used as control signals for Y-bits streams. The output per stream is represented in rows. Finally, at this step, there are X data streams, each of which contains Y samples.

Step 3 is to multiply the scalar matrix obtained in step 2 with the rows of the Kronecker matrix GX according to the principle of Sample Repeat and Scalar Multiplication (SRSM) on X data streams obtained in Step 2. Each output stream at this time will has N data samples. Adding the corresponding elements on the streams in modulo-2 finite field, the result is a sequence of N bits of output after encoding process.

In general, the proposed invention differs from the previous solutions in three points. The first is using parallel computing techniques at the encoding step to improve encoding processing speed as well as minimize computation time. The input bit sequence is divided into parallel streams, and the coding step is performed simultaneously on these parallel streams. The second is that elements of the Kronecker matrix are stored in read-only memory ROM and are generally reused to encode threads, thus saving hardware resources for data storage, especially in the case of large number of bits at input stream leading to the size of the Kronecker matrix increasing.

Patent Performance Example

Consider the case of a 4-bit input data string denoted as: $\{a_1,a_2,a_3,a_4\}$. The result of direct multiplication of this bit sequence with Kronecker matrix $G_4$ is presented as follows:

$$[a_1\ a_2\ a_3\ a_4]\begin{bmatrix}1&0&0&0\\1&1&0&0\\1&0&1&0\\1&1&1&1\end{bmatrix}=$$

$$[\,a_4+a_3+a_2+a_1\quad a_4+a_2\quad a_4+a_3\quad a_4\,]$$

It can be noticed that the essence of the scalar multiplication between the bit sequence and the column vectors of the Kronecker matrix is the addition of the input bit string elements according to the high level control signal, which is the column vector of the Kronecker matrix. For example, in the second column of the Kronecker matrix, the element in row 1 and row 3 is equal to "0", and in the second column of the output vector, two elements: $a_1$, $a_3$ are skipped. In the third column of the Kronecker matrix, the elements in rows 1 and 2 are equal to "0", and in the third column of the output vector, two elements that correspond with input bit sequence are skipped. In the fourth column of the Kronecker matrix, the elements in rows 1, 2 and 3 are equal to "0", and in the fourth column of the output vector, 3 elements that correspond with input bit sequence are skipped respectively. In general, the Bit Removal Rule (BRR) allows executing scalar multiplication of the input bit sequence with Kronecker matrix columns as follows: "If the element in row i, column j of the Kronecker matrix is equal 0, then in the j column of the output sequence, the $i^{th}$ position in addition of the input bit elements will be discarded".

Figure 4:
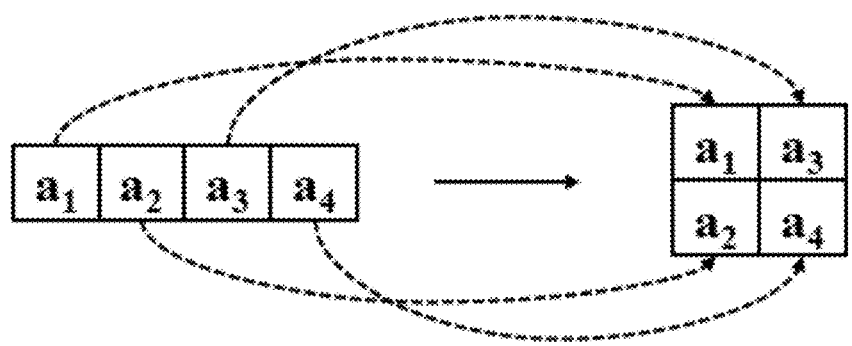
FIG. 4 depicts the principle of arranging the 4-bit sequence of inputs into a matrix according to the principle of first column, last row.

Performs a given input sequence of 4 bits into 2 parallel streams, each of 2 bits. Then rearranging them into a square matrix according to the principle Row After Column—RAC as described in FIG. 4 yields the following result:

$$\begin{bmatrix}a_1&a_3\\a_2&a_4\end{bmatrix}$$

Figure 5:
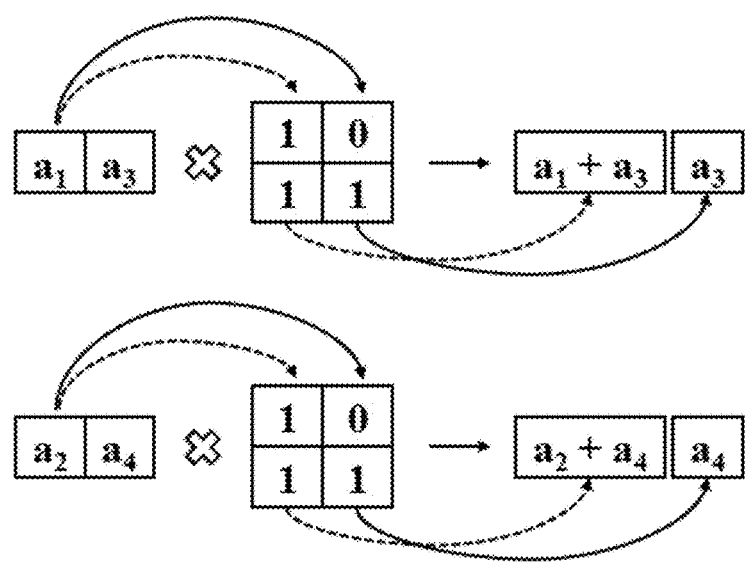
FIG. 5 depicts a multiplication 2-bit chain with a Kronecker matrix G2 based on the principle of bit elimination.

And then, view each row of the matrix obtained above as a 2-bits sub-string. Then we have two substrings, and, from now on, the scalar multiplication of these 2-bits sub-strings with the Kronecker matrix G2 will follows the Bit Removal Rule (BRR) as described in FIG. 5, the results obtained on each 2-bit substring are written in rows as below:

$$\begin{bmatrix}a_1+a_3&a_3\\a_2+a_4&a_4\end{bmatrix}$$

Figure 6:
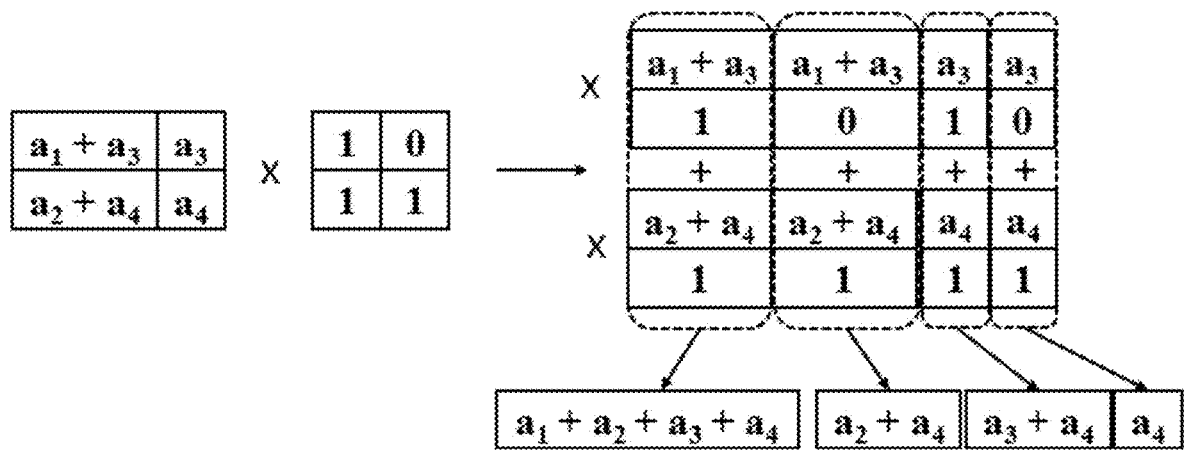
FIG. 6 depicts multiplication of data sample series with Kronecker matrix G2 based on the principle of sample repeat and scalar multiple.

FIG. 6 depicts the procedure for performing a Sample Repeat and Scalar Multiple (SRSM) for each column of the matrix obtained above with each column of the Kronecker matrix G2. As can be seen from FIG. 6, the essence of column-based scalar multiplication is the repeat of data samples in rows then performing addition and multiplication operations in modulo 2. Indeed, considering the first sub-string: $\{a_1+a_3,\ a_3\}$ and the first row of matrix G2: $\{1,0\}$. Each element in the sequence is repeated two times, becoming: $\{a_1+a_3,a_1+a_3,a_3,a_3\}$. At the same time, the rows of the Kronecker G2 matrix in order are also repeated two times and become: $\{1,0,1,0\}$. Performing an one-by-one multiplication of two elements in two sequences after repeating the sample, we obtain sequence A: $\{a_1+a_3,0,a_3,0\}$. Doing the same for the second sub-string: $\{a_2+a_4,a_4\}$ and the second row of the matrix G2: $\{1,1\}$, we obtain the sequence B: $\{a_2+a_4,a_2+a_4,a_4,a_4\}$. Adding one-by-one to each element on the two sequence A and B yields the same result as a direct multiplication by traditional methods, we have: $[a_4+a_3+a_2+a_1\ a_4+a_2\ a_4+a_3\ a_4]$.

Note that the final output bit sequence is the result obtained with addition and multiplication operations performed in modulo 2. In this field, the "addition" operator corresponds to the "XOR 2 bits" operation and the "multiplication" operator correspond to "AND 2 bits" operations.

In order to prove the effectiveness and correctness of the invention, the proposed method in this invention is integrated into the downlink signal processing flow of the Physical Broadcast Channel (PBCH) of the 5th next generation mobile communication system. For the PBCH channel, an input sequence with 56 bits in length is sent through an interleaving block to prevent burst errors, before forwarding into the bit position assignment block to determine the position of the information bits. The output of this block is a sequence of 512 bits that contains 56 information bits and 456 redundant bits. This 512-bit string is included in the polarization encoder using the Parallel Computation for Polarization Encoding (PCPE) as proposed in the invention.

Figure 8:
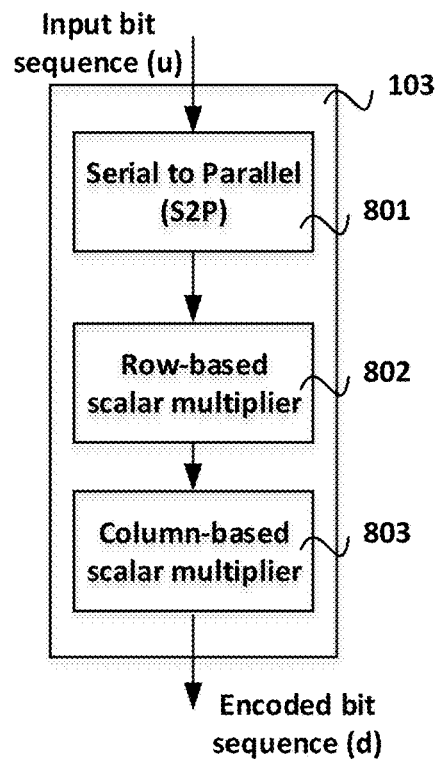
FIG. 8 depicts the block diagram showing the coding steps according to the proposed method of the invention.

The polarization coding unit using Parallel Computation for Polarization Encoding (PCPE) method consists of 3 sub-blocks as shown in FIG. 8, which are completely designed on Field Programmable Gate Array (FPGA) to take advantage of fast processing capabilities. Accordingly, the serial to parallel block 801 divides the 512-bits input sequence into 8 parallel streams, each of which has a length of 64 bits according to the principle Row After Column (RAC). Row-based scalar multiplier 802 receives 8 parallel 64-bits sequences output of 801, and then performs scalar multiplication independently each 64-bits sequence with each column of the squared Kronecker matrix G64 following the principle Bit Removal Rule (BRR). The elements of the Kronecker G64 matrix are fixed to the Physical Broadcast Channel (PBCH), so the elements on the columns of this matrix can be stored in read-only memory (ROM) and can be used for all 8 data streams together. Eight 64-samples data streams at the output of 802 are brought to the column-based scalar multiplication 803. In here, eight 64-samples data streams will be multiplied by the Kronecker matrix G8 in principle SRSP to obtain 512 bit output sequence. Similarly, elements of the Kronecker matrix G8 are fixed to the Physical Broadcast Channel (PBCH), therefore, the rows of the G8 matrix can be stored in read-only memory (ROM) and are shared for all 8 data streams.

Figure 22:
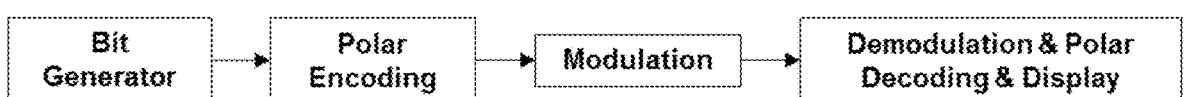
FIG. 22 illustrates a polar coding test scheme according to the proposed method of the present invention.

The proposed polarization coding testing system as described in FIG. 22 includes the polarization encoder, input signal generator and data decoding block by software. The input signal generator creates and transmits a 56-bit string as input of the polarization encoder. The polarization block uses the Parallel Computation for Polarization Encoding (PCPE) technique to encode the input 56-bit sequence into 512-bit output sequence.

The invention method is feasible, easy to apply and ensures the system performance requirements. Instead of performing sequentially multiplication the input bit sequence with Kronecker matrix, the Parallel Computation for Polarization Encoding (PCPE) technique performs polarization coding in parallel that divides the input bit sequence into parallel streams and perform simultaneously calculations on these parallel streams. This both ensures to reduce processing time, increase information processing speed, and also ensure efficient use of storage resources.

The invention claimed is:

1. A method of parallel calculation for a polarized coding system consists of the following steps:
   Step 1: dividing the to-be-encoded bits sequence into X streams with each stream having Y bit, wherein X is the number of streams, Y is the number of bits in each stream, both X and Y are positive integers, N is the number of bits of the to-be-encoded bits sequence and equals to X multiplied by Y;
   Step 2: performing scalar multiplication of each Y-bit stream obtained in step 1 by each column of a squared Kronecker matrix of order Y (denoted by $G_y$) to obtain X streams, each stream has Y samples, each sample is a scalar number and is the multiplication of each Y-bit stream from Step 1 and each column of the matrix $G_{-y}$ wherein X and Y are positive intergers from Step 1;
   Step 3: Obtaining X streams, each stream has N bits by duplicating each bit in each Y-bit stream gained from step 2 X times wherein X, Y and N are positive intergers from step 1;
   Step 4: Obtaining a matrix with X rows and N columns by duplicating each row of the squared Kronecker matrix of order X (denoted by $G_x$) Y times wherein X, Y and N are positive intergers from step 1;
   Step 5: Performing scalar multiplication of each sample in each stream from step 3 with each sample in each row of the matrix from step 4 to obtain X streams, each stream has N samples, each sample is the multiplication of each sample in each stream from step 3 with each sample in each row of the matrix from step 4; wherein X and N are positive integers from step 1;
   Step 6: Obtaining a bit sequence by performing addition of each sample in each stream from step 5 in combination with a modulo operation.

2. The method according claim 1, wherein step 1 of the method further comprises:
   obtaining X bit-streams, each stream has Y bits according to the following definition:
   the $k^{th}$ stream consists of Y bits:
   $\{B_k, B_{X+k}, B_{2X+k}, B_{3X+k} \ldots, B_{(y-1)X+k)}\}$
   wherein, k is a positive interger, k={1, 2, 3, . . . , X} that indicate $k^{th}$ stream of X streams; $\{B_k, B_{X+k}, B_{2X+k}, B_{3X+k} \ldots, B_{(y-1)X+k)}\}$ is a binary representation indicating bits at position $k^{th}$, $(X+k)^{th}$, $(2X+k)^{th}$, $(3X+k)^{th}$, . . . , $((Y-)X+k)^{th}$ of to-be-encoded input bit sequence with length N.

3. The method according claim 1, wherein step 3 of the method further comprises:
   duplicating each sample in each Y-sample stream gained from step 2 X times according to the following definition:
   the $k^{th}$ stream consists of N bits:
   $\{B_k, B_k, \ldots, B_k, B_{X+k}, B_{X+k}, \ldots, B_{X+k}, B_{2X+k}, B_{2X+k}, \ldots, B_{2X+k}, \ldots, B_{(Y-1)X+k}, B_{(Y-1)X+k}, \ldots, B_{(Y-1)X+k}\}$
   wherein k is a positive interger, k={1, 2, 3, . . . , X} that indicating $k^{th}$ stream of X streams; $\{B_k, B_{X+k}, B_{2X+k}, B_{3X+k} \ldots, B(Y-1)X+k\}$ is a binary representation indicating bits at position $k^{th}$, $(X+k)^{th}$, $(2X+k)^{th}$, . . . , $((Y-1)X+k)^{th}$ of to-be-encoded input bit sequence with length N from claim 2, each bit $B_j$ with j={k, X+k, 2X+k, . . . , ((Y-1)X+k)} is duplicated X times.

4. The method according claim 1 wherein step 5 of the method further comprises:
   obtaining X output streams, each stream has N samples, each sample is the product of each element in each stream from step 3 of claim 3 with each element in each row of the matrix from step 4 of claim 3 according to the following definition:
   $k^{th}$ stream consists of N samples:
   $\{D_{(k,1)}, D_{(k,2)}, D_{(k,3)}, D_{(k,4)}, \ldots, D_{(k,N)}\}$
   wherein k is a positive integer that indicate stream index, k={1, 2, . . . , X}; X is number of streams; $D_{(k,1)}$ with i={1, 2, . . . , N} is used to represent $i^{th}$ output sample of $k^{th}$ stream.

5. The method according to claim 1 wherein step 6 of the method further comprises:
   obtaining the output stream with length N by performing element-by-element addition of each stream from claim 4 according to the following formula:

$$S_i = \sum_{k=1}^{X} D_{(k,i)}$$

wherein, k is a positive interger that indicate stream index, k={1, 2, . . . , X}; i is a positive interger that indicate sample index of output stream, i={1, 2, . . . , N}; $D_{(k,i)}$ is used to represent $i^{th}$ sample in $k^{th}$ stream; $S_i$ is used to represent $i^{th}$ sample of the output stream; And
   obtaining each encoded bit (denoted by $C_i$) according to the following formula: $C_i$=modulo($S_i$,2); Wherein $C_i$ is used to represent $i^{th}$ bit of the polar encoded bit stream, $C_i$={0, 1}, "Modulo" operation is used to find the remainder of the division of $S_i$ by 2.

* * * * *